United States Patent
Tolsa et al.

(10) Patent No.: US 9,784,596 B2
(45) Date of Patent: Oct. 10, 2017

(54) METHOD, SENSOR, AND PRINTED CIRCUIT BOARD FOR SENSING POSITION OR MOTION OF A SHAFT

(71) Applicant: ABB Schweiz AG, Baden (CH)

(72) Inventors: Kimmo Tolsa, Lappeenranta (FI); Rafal Jastrzebski, Lappeenranta (FI); Tuomo Lindh, Lappeenranta (FI)

(73) Assignee: ABB Schweiz AG (CH)

( * ) Notice: Subject to any disclaimer, the term of this patent is extended or adjusted under 35 U.S.C. 154(b) by 0 days.

(21) Appl. No.: 15/126,209

(22) PCT Filed: Mar. 13, 2015

(86) PCT No.: PCT/EP2015/055253
§ 371 (c)(1),
(2) Date: Sep. 14, 2016

(87) PCT Pub. No.: WO2015/136063
PCT Pub. Date: Sep. 17, 2015

(65) Prior Publication Data
US 2017/0089734 A1    Mar. 30, 2017

(30) Foreign Application Priority Data
Mar. 14, 2014  (EP) .................................... 14159872

(51) Int. Cl.
*G01D 5/24* (2006.01)
*G01D 11/24* (2006.01)
(Continued)

(52) U.S. Cl.
CPC .............. *G01D 5/24* (2013.01); *G01D 11/245* (2013.01); *H05K 1/0219* (2013.01); *H05K 1/115* (2013.01);
(Continued)

(58) Field of Classification Search
CPC ........ G01D 5/24; G01D 11/245; H05K 1/115; H05K 1/162; H05K 1/0219; H05K 2201/10151; H05K 2201/09645
See application file for complete search history.

(56) References Cited

U.S. PATENT DOCUMENTS

| 5,627,316 A | 5/1997 | De Winter et al. |
| 2001/0048247 A1* | 12/2001 | Bae ...................... G06F 3/0202 307/112 |

(Continued)

FOREIGN PATENT DOCUMENTS

| DE | 19808665 C1 | 8/1999 |
| EP | 1143225 A2 | 10/2001 |

OTHER PUBLICATIONS

European Patent Office, International Search Report & Written Opinion issued in corresponding Application No. PCT/EP2015/055253, mailed Jun. 1, 2015, 8 pp.
(Continued)

*Primary Examiner* — Hoa C Nguyen
(74) *Attorney, Agent, or Firm* — Taft Stettinius & Hollister LLP (57) ABSTRACT

The present disclosure presents a method, a sensor comprising printed circuit board (PCB), and a sensor PCB for a capacitive sensor for sensing position or motion of a shaft comprising an electrically conducting part. The method and the sensor utilize the sensor PCB that comprises a mounting hole through which the conducting part of the shaft can be mounted, at least one capacitor electrode formed to the printed circuit board, wherein an electrode surface of the electrode extends parallel to a center axis of the mounting hole and faces the center axis.

20 Claims, 5 Drawing Sheets

(51) Int. Cl.
*H05K 1/11* (2006.01)
*H05K 1/02* (2006.01)
*H05K 1/16* (2006.01)

(52) U.S. Cl.
CPC ... *H05K 1/162* (2013.01); *H05K 2201/09645* (2013.01); *H05K 2201/10151* (2013.01)

(56) References Cited

U.S. PATENT DOCUMENTS

| | | | | |
|---|---|---|---|---|
| 2006/0267109 A1* | 11/2006 | Ohguro | ............... | B81C 1/00333 257/396 |
| 2011/0298711 A1* | 12/2011 | Dean | ................... | G06F 3/03547 345/161 |
| 2012/0132001 A1* | 5/2012 | Lu | ......................... | G01P 15/125 73/504.14 |

OTHER PUBLICATIONS

European Patent Office, Extended Search Report issued in corresponding Application No. 14159872.2, dated Nov. 12, 2014, 5 pp.

* cited by examiner

METHOD, SENSOR, AND PRINTED CIRCUIT BOARD FOR SENSING POSITION OR MOTION OF A SHAFT

FIELD OF THE INVENTION

The presented invention relates to motion and position sensors, and more particularly to the use of a capacitive sensor for sensing motion of a rotor of an electrical machine.

BACKGROUND INFORMATION

Motion control systems typically require position feedback. For example, an active magnetic bearing control may require non-contact position sensors for feedback signal in order to be able to keep the position of a rotor within allowable tolerances. Position feedback can be achieved by eddy-current, inductive, capacitive or optical sensors, for example.

Capacitive displacement sensors are frequently used in industry in a wide variety of applications including precise positioning, motion control, semi-conductor processing, and assembly of equipment, thickness measurements, tools metrology and assembly line testing.

In order to measure the distance between two conductive materials, a capacitive sensing system may utilise an equation for approximating capacitance C of a parallel-plate capacitor:

$$C = \epsilon_0 \epsilon_r S/r, \quad (1)$$

where $\epsilon_0$ is the permittivity of free space (electric constant), $\epsilon_r$ is the relative static permittivity (dielectric constant) of the insulating material in the gap between the capacitor plates, S is the area of the plates, and r is the distance between the plates.

Assuming that the area S and dielectric $\epsilon_0 \epsilon_r$ of the material in the gap (usually air) remain constant, the capacitance value C reflects the changes in the distance r between the probe electrode and the target. The capacitive sensing system may be configured to measure the capacitance (or its changes) and therefore a distance (or motion). The current i in the capacitor is proportional to the capacitance value C and to the rate of change of voltage dv/dt across the capacitor (i=Cdv/dt).

With capacitive displacement sensors, high-resolution measurements of the position and motion of a conductive target may be achieved. In the case of position measurement of a rotor of an electrical machine, a sensor tip may be mounted around the shaft for each measured dimension (degree of freedom).

However, precise position and motion sensors may also have major disadvantages in industrial applications. The sensors may be expensive and complex to manufacture. They may be prone to mounting and assembly errors. The sensors may introduce significant delays to the measurements. Further, the sensors may have significant temperature dependence and they may be sensitive to noise. When interfacing indirectly with a motion controller or a rotor, for example, the sensor(s) may be susceptible to electromagnetic interferences and/or mechanical damage. Electromechanical runout of the rotor may also pose a major challenge for the control system.

BRIEF DISCLOSURE

An object of the present invention is to provide a method and an apparatus for implementing the method so as to alleviate the above disadvantages. The objects of the invention are achieved by a method and an apparatus which are characterized by what is stated in the independent claims. The preferred embodiments of the invention are disclosed in the dependent claims.

A capacitive sensor that is capable of sensing position or motion of an electrically conductive shaft can be implemented by using a printed circuit board (PCB) having a mounting hole through which the shaft can be mounted.

The printed circuit board may comprise at least one electrode (i.e. capacitor plate) formed to the PCB. The electrode forms a capacitor with the surface of the conducting shaft. Capacitance of the formed capacitor can be measured. Since the capacitance is responsive to the gap between the electrode and the surface of the shaft, the capacitance can be used for estimating the position of the shaft.

An electrode surface of the electrode in/on the printed circuit board may extend parallel to a center axis of the mounting hole. The PCB may be configured such that a plurality of capacitor electrode formed to the PCB face the center axis, and form an annular shape around the center axis. The electrode surfaces may be formed by using a PCB hole plating process, for example. The edge of the mounting hole may be plated, or vias or plated holes may be used next to the mounting hole.

The PCB may also comprise at least one capacitor electrode formed to the PCB where an electrode surface of the electrode extends along a plane that is perpendicular to the center axis of the mounting hole. The perpendicularly extending capacitor electrodes may be formed by using a PCB trace layer manufacturing process, such as etching.

The disclosed sensor may be used to detect one- to six-dimensional motions, for example. In order to maximise the sensitivity, the sensor's measurement electronics may utilise the use of LC (or LRC) resonance, high frequency oscillating signals, filters and differential amplifiers, for example.

The disclosed sensing method provides an affordable and robust approach for position sensing. It provides means for a precise non-contact measurement of the position and motion or of geometric properties of a conducting target. By manufacturing the sensor on a PCB, the manufacturing costs can be decreased considerably, the system integration can be increased, and system connectivity and interfacing can be improved.

BRIEF DESCRIPTION OF THE DRAWINGS

In the following the invention will be described in greater detail by means of preferred embodiments with reference to the attached drawings, in which.

DETAILED DISCLOSURE

The present disclosure discloses a method and sensor for sensing position (e.g. displacement) or motion of a shaft that comprises an electrically conducting part. The shaft may be a metal shaft of a rotor of an electrical machine, for example. The position or motion of an electrically conducting shaft or a shaft comprising an electrically conducting part can be accurately determined by using a sensor printed circuit board (PCB) that comprises a mounting hole configured to receive an electrically conducting part of the shaft therethrough and capacitor electrodes formed around the mounting hole.

The sensor PCB can be used for detecting six degrees of freedom. With the PCB, translations (i.e. movements, displacements) of the shaft along three axes x, y, and z of Cartesian coordinate system and rotations α, β, and θ of the shaft around the axes can be detected, for example.

Figure 1A:
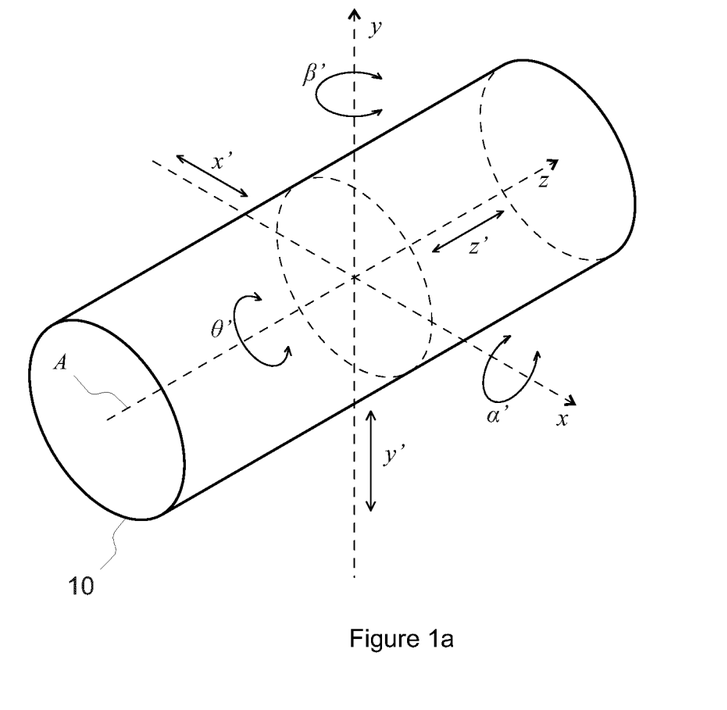
FIG. 1a shows an exemplary shaft with six degrees of freedom.

FIG. 1a shows an exemplary shaft 10 with six degrees of freedom. The shaft 10 has a cylindrical shape having a center axis A. In FIG. 1a, the Cartesian coordinate system is arranged such that the z-axis coincides with the center axis A. The x- and y-axes extend along a plane that is perpendicular to the center axis A. In FIG. 1a, the x- and y-axes are perpendicular to each other.

In FIG. 1a, z' refers to an axial displacement, i.e. to a displacement along the center axis A (also the z-axis in FIG. 1a). x' and y' refer to radial displacement, i.e. to displacements that extend along a plane that is perpendicular to the center axis A. In FIG. 1a, displacements x' and y' extend along x- and y-axes, respectively. Therefore, they are perpendicular also with respect to each other. The shaft may be arranged to rotate about the center axis A. In FIG. 1a, θ' refers to rotation of the shaft about the center axis A (also the z-axis in FIG. 1a). α' and β' refer to rotations about x- and y-axes, respectively. The same notation of the degrees of freedom is used in the following paragraphs.

In order to detect a displacement or a rotation of a shaft comprising an electrically conductive part, an arrangement according to the present disclosure may be used. An arrangement according to the present disclosure may comprise a sensor PCB according to the present disclosure, and a shaft with its electrically conductive part mounted to the mounting hole of the sensor PCB.

Figure 1B:
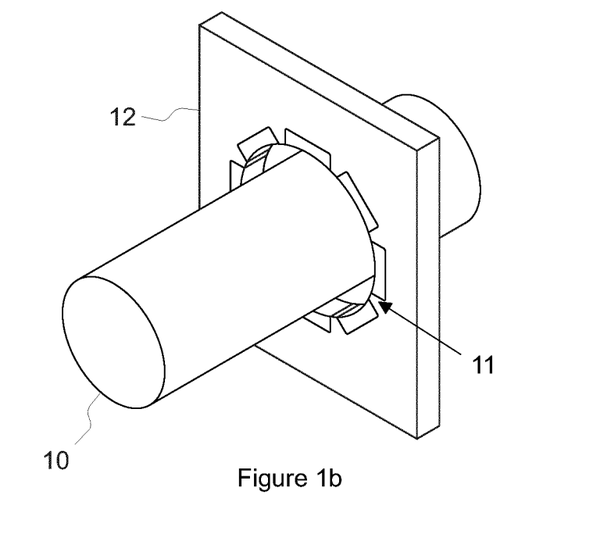
FIG. 1b shows an exemplary arrangement according to the present disclosure.

FIG. 1b shows an exemplary embodiment of an arrangement according to the present disclosure. In FIG. 1b, a shaft 10 comprises an electrically conductive part that is mounted to a mounting hole 11 of a sensor PCB 12.

A sensor PCB according to the present disclosure may comprise at least one capacitor electrode facing the center axis of the mounting hole. The electrode may be formed to the sensor PCB so that an electrode surface of the electrode extends parallel to a center axis of the mounting hole thereby forming an axial electrode surface. The axial electrode surface may be formed by conductive plating on the inner wall of the mounting hole, for example.

Figure 2A:
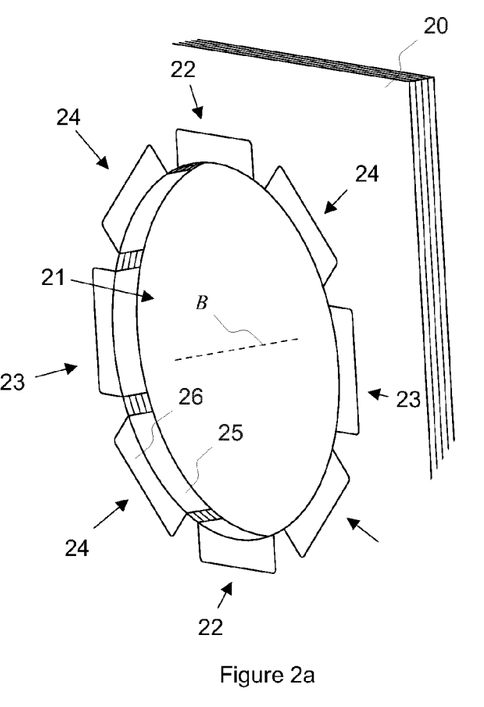
FIGS. 2a to 2e show an exemplary embodiment of a sensor PCB of the present disclosure.

FIGS. 2a to 2e show an exemplary embodiment of the disclosed sensor PCB. In FIG. 2a, a PCB 20 comprises a circular mounting hole 21. The center axis B of the mounting hole 21 is shown as a dashed line. Since the hole 21 has a circular cross section in FIG. 2a, the center axis B passes through the centre of the circular cross section. However, in more general terms, a center axis can be considered a center line that passes through a center of gravity of a cross section along the plane of the PCB, for example.

When a part of the shaft with an electrically conductive surface is mounted to the mounting hole, an axial electrode surface facing the shaft forms a capacitor together with the surface of the shaft that acts as an opposite electrode. The capacitance of this capacitor may be measured and radial displacement may be determined on the basis of the capacitance. The axial electrode surface may be formed by using a PCB hole plating process, for example.

Figure 2B:
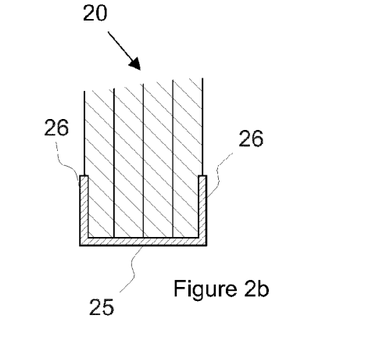

In FIG. 2a, the PCB 20 comprises a plurality of capacitor electrodes 22, 23, and 24 formed to the printed circuit board. FIG. 2b shows a cross section of one of the electrodes 22, 23, and 24. By using multiple capacitor electrodes on the PCB 20 around a conducting part of shaft received into the mounting hole 21, the sensing accuracy may be increased as the influence of noise and runout of the shaft can be minimised.

In FIG. 2a, the PCB 20 has eight capacitor electrodes 22, 23, and 24. Four detector electrodes 22 and 23 may be used as parts of the resonant detecting circuits and the other four electrodes 24 may be used for electrically connecting the shaft to an analog signal ground of the PCB 20. In FIG. 2a, the detector electrodes 22 and 23 and the ground-connected electrodes 24 are arranged in an interleaved pattern. The number and relative positioning of electrodes on the PCB is not, however, limited to the configuration disclosed in FIG. 2a. Other number of electrodes and other relative positioning of electrodes may also be used.

Each electrode 22, 23, and 24 has an axial electrode surface 25 that extends parallel to a center axis of the mounting hole 21 and faces the center axis B. The axial electrode surfaces 25 are formed by conductive plating on the inner wall of the mounting hole 21. The electrodes 22, 23, and 24 form an annular shape around the center axis B.

Figure 2C:
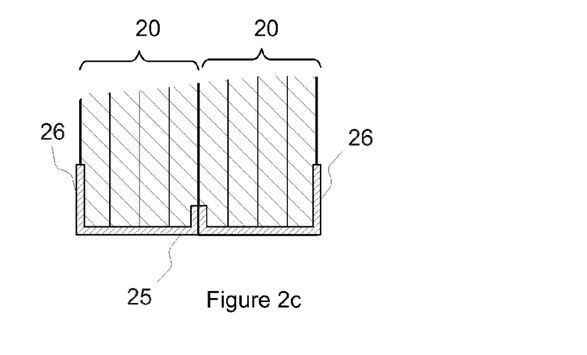

The sensor PCB 20 may comprise multiple layers, as shown in FIGS. 2a and 2b. 12. A capacitive sensor may also comprise a plurality of such PCBs stacked on top of each other, as shown in FIG. 2c. In FIG. 2c, the plated edges of the PCBs 20 together form a larger axial electrode surface 25.

In order to detect axial displacement of the shaft, for example, the PCB may also comprise at least one capacitor electrode formed to the printed circuit board such that the electrode comprises a radial electrode surface, i.e. a capacitor surface that extends along a plane that is perpendicular to the center axis of the mounting hole. The radial electrode surfaces may be formed by using a PCB trace layer manufacturing process, such as etching, for example.

Figures 2D, 2E:
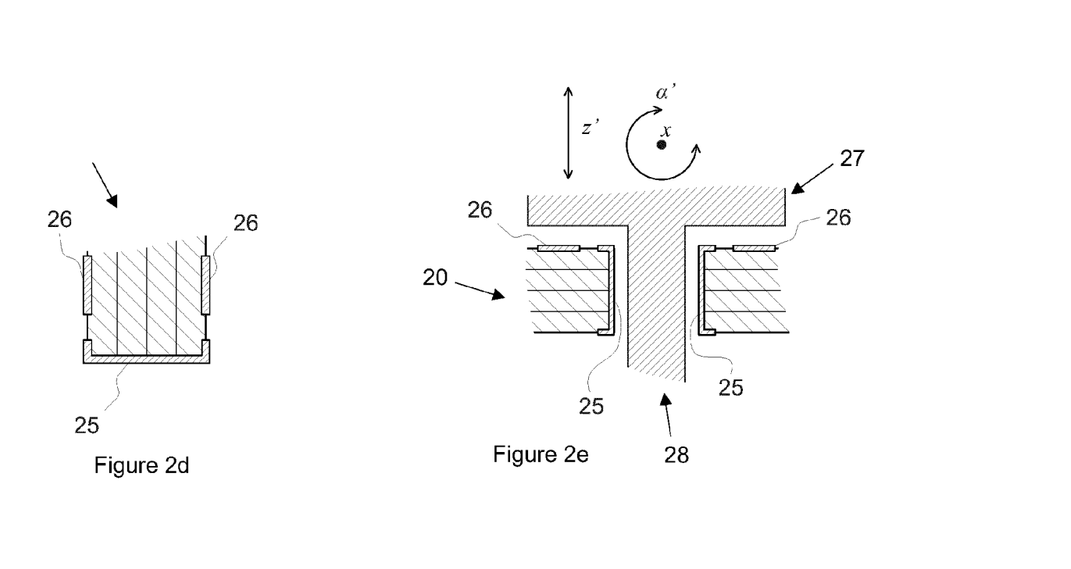

In FIGS. 2a to 2c, the electrodes 22, 23, and 24 also comprise radial electrode surfaces 26 that are connected to the axial electrode surfaces 25. Alternatively, the capacitor electrodes may be formed such that they comprise only one type of electrode surfaces (axial or radial). Radial electrode surface(s) 26 may be separate from the axial electrode surfaces 25, as shown in FIG. 2d. The separate radial electrode surfaces 26 may be used for detecting rotations α' and β', for example.

An arrangement for detecting rotations α' and/or β' may comprise a sensor PCB according to the present disclosure, and a shaft with an electrically conducting part mounted to the mounting hole. The PCB may comprise at least one capacitor electrode having a radial electrode surface, and the electrically conducting part of the shaft may be formed such that a capacitance formed by the part and the radial electrode surface is responsive to at least one of rotational angles about axes perpendicular to the rotational axis of the shaft.

FIG. 2e shows a cross-sectional side view of an exemplary arrangement where the sensor PCB 20 has radial electrodes 26 and axial electrodes 25, and the shaft 28 is provided with a tip having a disc-shaped, electrically conducting extension 27. The disc shaped extension 27 forms capacitances with the radial electrodes 26. When the shaft 28 tilts (i.e. rotates about axis x), the distance between one of the radial electrodes 26 in FIG. 2e and the disc 27 decreases and the capacitance between them increases. At the same time, the distance between the other radial electrode 26 in FIG. 2e and the disc 27 increases and the capacitance between them decreases. The difference between these two capacitances can be measured and the rotation α' can be determined on the basis of the difference.

In addition, displacement z' can also be determined by monitoring an average of the measured values of the capacitances.

In FIGS. 2a to 2e, the radial electrode surfaces are on the top and bottom layer of the PCB 20 (or the PCB stack). However, the radial electrode surfaces may be formed to the mid layers of the PCB as well.

In addition to the implementation of axial electrodes 22 in FIGS. 2a and 2b, electrode surfaces that extend parallel to the center axis can be formed in various other ways. For example, the PCB may comprise at least one capacitor electrode hole, where at least part of the axial electrode surface is formed by conductive plating on the capacitor electrode hole. The capacitor electrode hole can be implemented by using PCB vias placed near the edge of the mounting hole, for example.

Figures 3A, 3B:
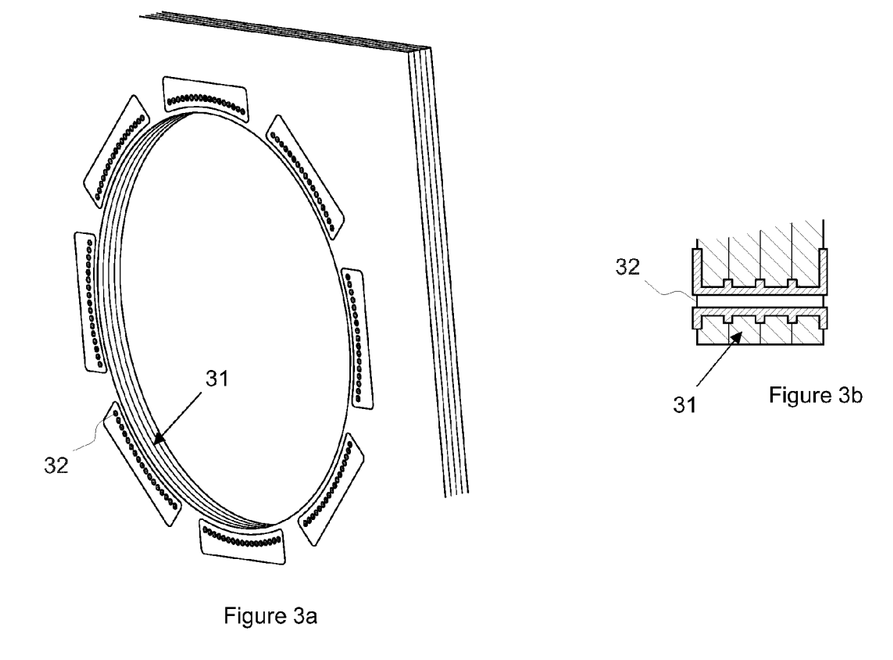
FIGS. 3a to 3c show exemplary embodiments of axial electrode implemented by using vias.
Figure 3C:
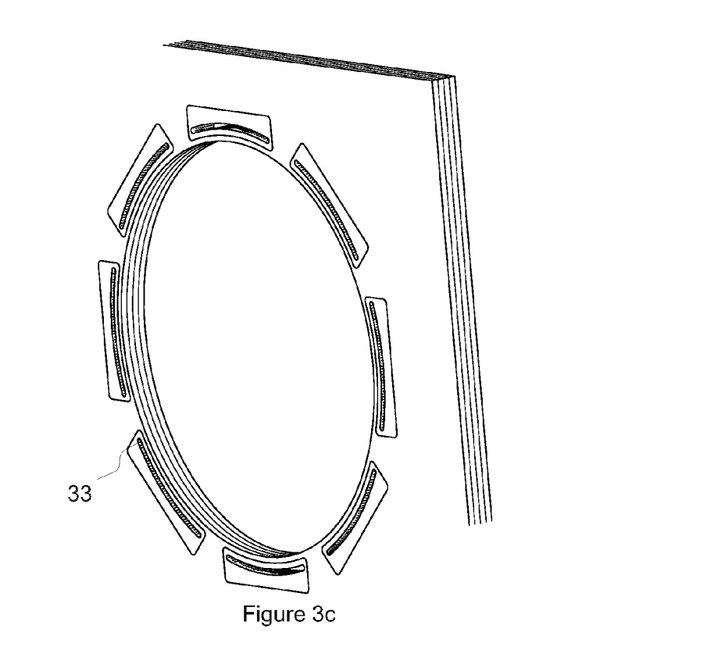

FIGS. 3a to 3c show exemplary embodiments of axial electrode implemented by using vias. FIG. 3a shows axial electrode surfaces of capacitor electrodes 31 formed by a plurality of side by side vias 32. The vias 32 are plated with an electrically conducting material. FIG. 3b shows a cross section of one of the vias 32. The part of the plating facing the mounting hole forms an axial electrode surface.

As shown in FIG. 3c the axial electrode surfaces may alternatively be formed by using a long plated slot 33 formed next to the edge of the mounting hole.

A capacitive sensor that is capable of sensing position or motion of an electrically conductive shaft may comprise a previously described sensor PCB (or a stack of the PCBs). In order to increase integration and decrease costs and noise susceptibility, the PCB may also be configured to accommodate electrical components implementing measurement circuitry of the capacitive sensor. Conductive traces forming connections between the components may also be formed on the sensor PCB. Detection signal generating circuitry and interfacing circuitry interfacing with the control system may also be mounted on the sensor PCB.

The sensor PCB (or the PCB stack) may be enclosed in a conducting case in order to shield the sensor against some electromagnetic interference. The sensor PCB may also comprise at least one shielding conductive layer for minimising electromagnetic interference on the at least one capacitor electrode. For example, the top and bottom layers of the sensor PCB (or of the PCB stack) may also be conductive layers connected to a ground potential.

Figure 4A:
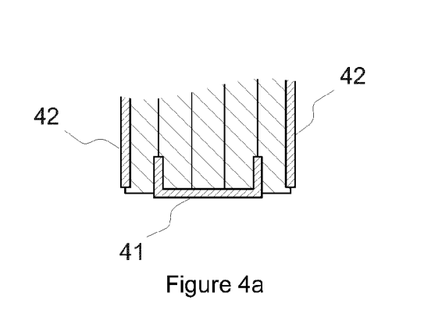
FIGS. 4a to 4d show various exemplary implementations of shielding.

FIGS. 4a to 4d show various exemplary implementations of shielding. FIG. 4a shows a cross section of an exemplary embodiment where an axial electrode surface 41 is electrically shielded by a conductive top and bottom layer 42.

Figure 4B:
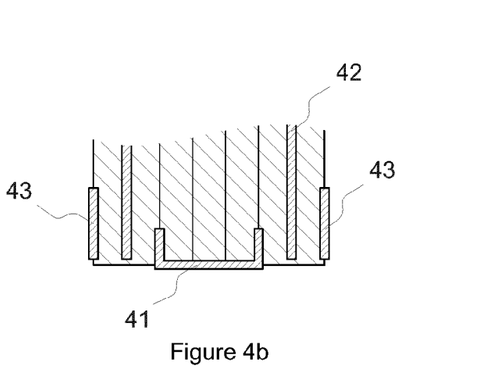
Figure 4C:
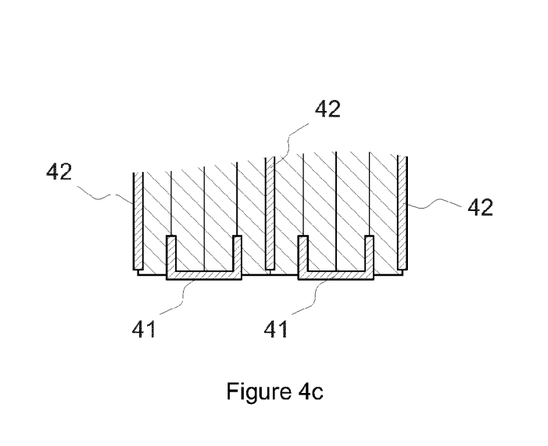

Conductive layers may also be used for minimising interference between electrodes. FIG. 4b shows an exemplary embodiment, where an axial electrode surface 41 is separated from radial electrodes 43 by a conductive layers 42 inside the PCB. FIG. 4c shows an exemplary embodiment of a sensor PCB which may be used for detecting rotations α' and/or β' (i.e. tilt of the shaft). In FIG. 4c, two separate axial electrodes 41 have a ground layer 42 between them.

Figure 4D:
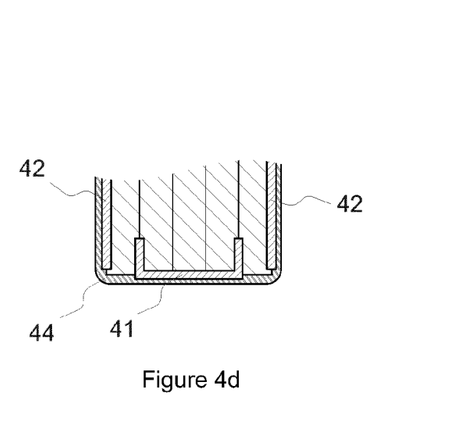

Further, in order to improve shielding against electromagnetic, environmental or other interference, the capacitor electrodes may be at least partially coated with a protective coating, such as epoxy filling. The protective coating on the capacitor electrode may increase sensor accuracy by increasing the relative static permittivity compared to air. Thus, thickness of the protective coating may be configured for maximising sensor accuracy. FIG. 4d shows a cross section of an exemplary embodiment where an axial electrode surface 41 is shielded by an epoxy filling 44 in addition to the conductive top and bottom layer 42.

Sensing position or motion of an electrically conductive shaft by using the disclosed sensor PCB can be implemented in various ways. One approach is to measure a time required to charge the capacitor to a certain voltage level or to measure a resonance frequency (time constant of a LRC or LC oscillator) of an oscillator formed by the capacitor together with resistive and/or inductive elements.

Another approach is to apply a fixed-frequency AC voltage across a capacitive series divider. The first of the series-connected capacitances is known. Capacitance of the second capacitor may be calculated from a ratio between the capacitances, where the ratio between the capacitances corresponds with a ratio between the amplitudes of the output and input signals.

Sensing accuracy may be increased by using a capacitance bridge configuration. For example, a pair of capacitor electrodes on opposite sides of the mounting hole may form two oscillators (LC or LRC). For example, electrodes 22 in FIG. 2a may form such a pair. Both oscillators may share a connection to an analog ground level through a capacitance formed by the shaft and capacitor electrode(s) on the PCB. In FIG. 2a, electrodes 24 form this capacitance.

Impedances of the oscillators depend on the position of the conducting shaft and the frequency of the used detection signal. The two oscillators may be supplied with a high-frequency alternating voltage. As the impedance changes responsive to the position, the positions may be estimated from the amplitudes of the generated AC signals of the two oscillators.

When the shaft is at an equal distance from both of the capacitor electrodes (e.g. electrodes 22 in FIG. 2a), the oscillators have the same impedances. Thus, the difference between signals of the oscillators is zero. However, if the shaft is closer to one electrode than the other, the signals have different amplitudes. A ratio between the amplitudes of the signals is responsive to the ratio of distances of the shaft with respect to the electrodes. Relative position and motion of the conducting shaft may be detected by measuring levels and changes of the current, voltages, or power of the oscillators, for example.

In order to measure the difference between the signals of the two oscillators, the signals may be demodulated and/or filtered and fed to a differential amplifier, for example. The signals may also be converted to a digital form, and the difference may be calculated in the digital domain.

Figure 5:
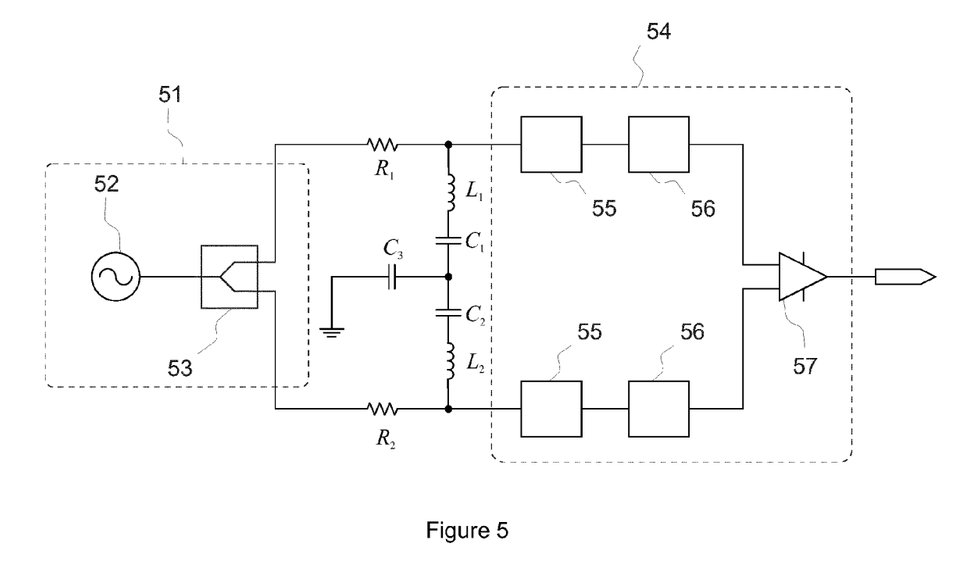
FIG. 5 shows an exemplary circuit diagram for a capacitive sensor comprising a sensor PCB as previously disclosed.

FIG. 5 shows an exemplary circuit diagram for a capacitive sensor comprising a sensor PCB as previously disclosed. The exemplary circuit may be used for determining a radial displacement of a rotor of an electrical machine in one dimension, for example. Other displacements (or rotations) may be measured with similar circuitries, for example.

In the following, the circuitry is explained in relation to the sensor PCB 20 of FIG. 2a. However, the circuitry is also applicable to other electrode configurations.

In FIG. 5, the capacitances formed by the shaft and the electrodes on the sensor PCB 20 are shown with references $C_1$, $C_2$, and $C_3$; $C_1$ represents a capacitance formed by one detection electrode 22 and the shaft; $C_2$ represents a capacitance formed by the other detection electrode 22 on the opposite side of the mounting hole 21 and the shaft; and $C_3$ represents a capacitance formed by the four ground-connected electrodes 24 and the shaft.

The circuitry in FIG. 5 also comprises inductances $L_1$ and $L_2$ and resistances $R_1$ and $R_2$. These resistances and inductances may be implemented as components soldered on the sensor PCB 20, for example. Capacitances $C_1$ and $C_3$, inductance $L_1$, and resistance $R_1$ form a first oscillator. Capacitances $C_2$ and $C_3$, inductance $L_2$, and resistance $R_2$ form a second oscillator.

In FIG. 5, the sensor comprises an AC signal generating circuitry 51. The circuitry comprises an AC signal generator 52 and a power divider 53. The AC signal generator 52 supplies the first and second oscillator with a high frequency AC signal through the power divider 53. The power divider 53 may be configured to minimise coupling between the first oscillator and the second oscillator.

The sensor further comprises measurement circuitry 54 in FIG. 5. The measurement circuitry 54 is connected in parallel with the LC elements of the first and the second oscillators. Capacitances $C_1$ and $C_3$, and inductance $L_1$ are the LC elements of the first oscillator; capacitances $C_2$ and $C_3$, and inductance $L_2$ are the LC elements are of the second oscillator. The measurement circuitry 54 may comprise a filter and a detector for each of the oscillators, for example. In FIG. 5, the measurement circuitry 54 comprises a series connection of a filter 55 and a power detector 56 for each oscillator.

For each oscillator, the power (or amplitude) of a signal passing through the LC elements of the oscillator is responsive to the distance between the electrode 22 and the shaft. This may be utilised in detecting position of the shaft. In FIG. 5, the power detectors 56 measure a differences between the power (or amplitude) of the AC signal generated by the generator 52 and the powers (or amplitudes) of the signals passing through the LC elements.

In order to determine the relative location, the measurement circuitry 54 may further comprise a differential amplifier 57 that measures the difference between powers (or signal amplitudes) detected by the power detectors 56.

The resulting difference may be used as an indicator signal for a displacement or a rotation. The difference may be converted into a digital form by using an ND converter, and used in a control system controlling the position of the shaft.

Alternatively, the signals may also be measured separately and converted into a digital form, and the resulting displacement(s) and/or rotation(s) may be calculated in a computing device.

The control system may be implemented on a computing device, for example. A computing device may be a CPU, a DSP, a PLD, or an FPGA, for example.

The measurement circuitry may also be connected in series with the LC elements. The position may be estimated by measuring the AC signal power (amplitude) transferred through LC elements.

The sensor PCB of the present disclosure may also be used for determining rotational angle (i.e. rotation θ' about a rotational axis of the shaft) or rotational speed.

The electrically conducting part of the shaft mounted into the mounting hole of the sensor PCB, or an extension of the part, may be formed such that a capacitance generated by the part and a capacitor electrode on the sensor PCB is a non-constant function of the rotational angle θ' about the rotational axis (e.g. center axis) of the shaft.

For example, a non-constant capacitance as a function of the rotational angle can be produced by using a disc shaped extension similar to that described in FIG. 2e. By adding radially extending grooves to face of the disc 27 facing the radial electrodes 26 in FIG. 2e, for example, the capacitances between the radial electrodes 26 and the disc 27 can be made responsive to rotation θ'. Detection of the rotation θ' may be decoupled from detections of rotations α' and β'. The sensor PCB may have separate radial electrodes for forming a separate set of capacitances dedicated for detecting rotation θ', and the grooves may extend only a part of the radius of the disc, for example.

The rotational angle may also be calculated from capacitances between the part and axial electrodes according to the disclosure. Axial electrodes used for detecting displacements of the shaft may also be used for detecting the rotational angle (or speed), for example. The part received into the mounting hole may be formed such that the capacitances between the axial electrodes and the conductive part act as a non-constant function of the rotational angle θ'.

The coupling between the detection of displacements and the detection of rotational angle may be minimized by using a conductive part mounted into the mounting hole having a non-circular cross section that is symmetrical with respect to the rotational axis. The part may be an attachable tip that has an elliptical cross section, for example. Alternatively, the part mounted into the mounting hole may have a (partial) coating resulting in a similar capacitance distribution.

The capacitances formed between the electrodes and the part (and/or its extension) mounted into the mounting hole may be measured, and the displacements and/or rotations can be determined on the basis of the measured capacitances. The measurements of the capacitances may be implemented by using differential amplifiers as shown in FIG. 5, for example. The capacitances may also be measured separately and converted into a digital form, and the resulting displacement(s) and/or rotation(s) may be calculated in a computing device.

It will be obvious to a person skilled in the art that the inventive concept can be implemented in various ways. The invention and its embodiments are not limited to the examples described above but may vary within the scope of the claims.

The invention claimed is:

1. A printed circuit board (PCB) for a capacitive sensor configured to sense position or motion of a shaft comprising an electrically conducting part, wherein the printed circuit board comprises
   a mounting hole configured to receive the electrically conducting part therethrough,
   at least one capacitor electrode formed to the printed circuit board, wherein an electrode surface of the electrode extends parallel to a center axis of the mounting hole and faces the center axis.

2. A printed circuit board according to claim 1, wherein the electrode surface has been formed by using a PCB hole plating process.

3. A printed circuit board according to claim 2, wherein at least part of the electrode surface is formed by conductive plating on the inner wall of the mounting hole.

4. A printed circuit board according to claim 3, comprising a plurality of capacitor electrodes formed to the printed circuit board, wherein electrode surfaces of the electrodes extend parallel to a center axis of the mounting hole and face the center axis, and wherein the electrodes form an annular shape around the center axis.

5. A printed circuit board according to claim 3 comprising at least one capacitor electrode having a radial electrode surface extending along a plane that is perpendicular to the center axis of the mounting hole.

6. A printed circuit board according to claim 2, further comprising at least one capacitor electrode hole, wherein at least part of the electrode surface is formed by conductive plating on the at least one capacitor electrode hole.

7. A printed circuit board according to claim 2, comprising a plurality of capacitor electrodes formed to the printed circuit board, wherein electrode surfaces of the electrodes extend parallel to a center axis of the mounting hole and face the center axis, and wherein the electrodes form an annular shape around the center axis.

8. A printed circuit board according to claim 2, wherein the printed circuit board is configured to accommodate electrical components implementing measurement circuitry of a capacitive sensor.

9. A printed circuit board according to claim 2, comprising at least one capacitor electrode having a radial electrode surface extending along a plane that is perpendicular to the center axis of the mounting hole.

10. A printed circuit board according to claim 1, comprising a plurality of capacitor electrodes formed to the printed circuit board, wherein electrode surfaces of the electrodes extend parallel to a center axis of the mounting hole and face the center axis, and wherein the electrodes form an annular shape around the center axis.

11. A printed circuit board according to claim 1, wherein the printed circuit board is configured to accommodate electrical components implementing measurement circuitry of a capacitive sensor.

12. A printed circuit board according to claim 1, wherein the printed circuit board comprises at least one shielding conductive layer for minimizing electromagnetic interference on the at least one capacitor electrode.

13. A printed circuit board according to claim 1, wherein the at least one capacitor electrode is at least partially coated with protective coating, such as epoxy filling.

14. A printed circuit board according to claim 1, comprising
at least one capacitor electrode having a radial electrode surface extending along a plane that is perpendicular to the center axis of the mounting hole.

15. A capacitive sensor comprising a printed circuit board (PCB) according to claim 1.

16. A capacitive sensor according to claim 15, comprising a plurality of printed circuit boards (PCB) stacked on top of each other.

17. An arrangement comprising
a printed circuit according claim 1, and
a shaft comprising an electrically conductive part mounted to the mounting hole of the printed circuit board.

18. An arrangement according to claim 17, wherein the printed circuit board comprises
at least one capacitor electrode formed to the printed circuit board has a radial electrode surface of the electrode that extends along a plane that is perpendicular to the center axis of the mounting hole, and
the part mounted to the mounting hole is formed such that a capacitance formed by the part and the radial electrode surface is responsive to at least one of rotational angles about axes perpendicular to the rotational axis of the shaft.

19. An arrangement according to claim 17, wherein the part mounted to the mounting hole is formed such that a capacitance formed by the part and the at least one capacitor electrode is responsive to the rotational angle about the rotational axis of the shaft.

20. A method for sensing position or motion of a shaft comprising an electrically conducting part, wherein the method comprises:
providing a printed circuit board including a mounting hole configured to receive the electrically conducting part therethrough, at least one capacitor electrode formed to the printed circuit board, and wherein an electrode surface of the electrode extends parallel to a center axis of the mounting hole and faces the center axis; and
sensing the position or the motion of the shaft by using the printed circuit board.

* * * * *